(12) United States Patent
Tamura et al.

(10) Patent No.: US 9,512,968 B2
(45) Date of Patent: Dec. 6, 2016

(54) LED MODULE

(71) Applicants: CITIZEN HOLDINGS CO., LTD., Tokyo (JP); CITIZEN ELECTRONICS CO., LTD., Yamanashi (JP)

(72) Inventors: Ryo Tamura, Yamanashi (JP); Takashi Akiyama, Saitama (JP)

(73) Assignees: CITIZEN HOLDINGS CO., LTD., Tokyo (JP); CITIZEN ELECTRONICS CO., LTD., Yamanashi (JP)

( * ) Notice: Subject to any disclaimer, the term of this patent is extended or adjusted under 35 U.S.C. 154(b) by 82 days.

(21) Appl. No.: 14/397,870

(22) PCT Filed: May 10, 2013

(86) PCT No.: PCT/JP2013/063187
§ 371 (c)(1),
(2) Date: Oct. 30, 2014

(87) PCT Pub. No.: WO2013/168802
PCT Pub. Date: Nov. 14, 2013

(65) Prior Publication Data
US 2015/0124455 A1    May 7, 2015

(30) Foreign Application Priority Data

May 11, 2012 (JP) ................. 2012-109288

(51) Int. Cl.
*F21V 13/08* (2006.01)
*H01L 25/075* (2006.01)
(Continued)

(52) U.S. Cl.
CPC ............... *F21K 9/30* (2013.01); *F21V 13/08* (2013.01); *F21V 19/002* (2013.01);
(Continued)

(58) Field of Classification Search
CPC ............... F21K 9/30; F21K 9/56; F21K 9/50; F21V 19/002; F21V 13/08; H01L 25/0753; H01L 2224/16225; H01L 2224/48137; H01L 2224/48091; H01L 2924/19107
See application file for complete search history.

(56) References Cited

U.S. PATENT DOCUMENTS

| 2008/0061717 A1 | 3/2008 | Bogner et al. |
| 2011/0114978 A1 | 5/2011 | Kojima et al. |

(Continued)

FOREIGN PATENT DOCUMENTS

| JP | 2006-156662 A | 6/2006 |
| JP | 2007-157690 A | 6/2007 |

(Continued)

OTHER PUBLICATIONS

International Search Report for PCT/JP2013/063187, Jun. 4, 2013.

*Primary Examiner* — Sharon Payne

(57) ABSTRACT

Provided is an LED module that can be easily manufactured while maintaining good reflective characteristics even when a plurality of LED elements and other electronic components are packaged on a circuit substrate. This LED module is characterized by having: a sub-mounting substrate for packaging a plurality of LED elements; a module substrate for packaging an electronic component other than the plurality of LED elements, the sub-mounting substrate being mounted on the module substrate; a dam material disposed on the module substrate and surrounding a mounting part of the sub-mounting substrate; and a cover member for covering top faces of the plurality of LED elements, the cover member being filled into an inside region of the dam material; the reflectance of a surface of the sub-mounting substrate being set higher than the reflectance of a surface of the module substrate.

14 Claims, 6 Drawing Sheets

(51) Int. Cl.
*F21K 99/00* (2016.01)
*F21V 19/00* (2006.01)
*H01L 33/60* (2010.01)

(52) U.S. Cl.
CPC .......... *H01L 25/0753* (2013.01); *H01L 33/60* (2013.01); *H01L 2224/16225* (2013.01); *H01L 2224/48091* (2013.01); *H01L 2224/48137* (2013.01); *H01L 2924/19107* (2013.01)

(56) References Cited

U.S. PATENT DOCUMENTS

| | | |
|---|---|---|
| 2011/0222264 A1 | 9/2011 | Matsuda et al. |
| 2012/0007076 A1 | 1/2012 | Cho |
| 2013/0034921 A1 | 2/2013 | Kojima et al. |
| 2013/0207142 A1* | 8/2013 | Reiherzer ............. H01L 33/507 257/98 |

FOREIGN PATENT DOCUMENTS

| | | |
|---|---|---|
| JP | 2007-324204 A | 12/2007 |
| JP | 2008-515207 A | 5/2008 |
| JP | 2010-170945 A | 8/2010 |
| JP | 2011-009572 A | 1/2011 |
| JP | 2011-14878 A | 1/2011 |
| JP | 2011-108911 A | 6/2011 |
| JP | 2011-181609 A | 9/2011 |
| JP | 2011-216868 A | 10/2011 |

* cited by examiner

LED MODULE

TECHNICAL FIELD

The present invention relates to an LED module constructed by mounting a plurality of LED elements on a circuit substrate along with other electronic components.

BACKGROUND

Lighting equipment using LED elements has come into wide use. Here, if it is desired to shorten the design lead time for lighting equipment such as desk lamps and other lighting lamps, it is recommended to modularize light source units. For example, FIG. 2 in patent document 1 shows an LED module constructed by mounting a plurality of LED chips (LED elements) and a lighting circuit on the same substrate.

FIG. 7 is a diagram redrawn from FIG. 2 given in patent document 1, showing a cross-sectional view of an LED lamp that uses a lamp base (GX53 type) conforming to the IEC standard.

The LED module shown in FIG. 7 comprises a circuit substrate 2, a driver circuit 4 (lighting circuit), and LEDs 3 (LED elements). The driver circuit 4 is mounted on the upper surface of the circuit substrate 2, while the LEDs 3 are mounted on the lower surface of the circuit substrate 2. The LED module shown in FIG. 7 is fitted into the housing of a lamp base 1, and is held in place by means of a lamp cover case 5. If it is desired to reduce the thickness of the module, the LEDs 3 should be mounted using a technology known as COB (Chip on Board). COB is a technology that mounts LED elements in bare chip form (hereinafter called the LED dies unless specifically designated otherwise) directly on the circuit substrate 2.

When mounting the LED dies using the COB technology, at least the area where the LED dies are mounted on the surface of the circuit substrate must be made to have a high reflectance. For example, in FIG. 3 given in patent document 2, there is shown a light-emitting module 1a (LED module) in which the LED die mounting area on the surface of the circuit substrate is made to have a high reflectance.

FIG. 8 is a diagram redrawn from FIG. 3 given in patent document 2, showing a plan view of the light-emitting module 1a as viewed from the light-emitting side thereof (hereinafter called the upper surface side).

No electronic components other than the light-emitting elements 21 (LED dies) are mounted on the module substrate 5b (circuit substrate) of the light-emitting module 1a. Further, the light-emitting module 1a has a COB-type structure. A reflective layer 11, a positive electrode power feed conductor 12, and a negative electrode power feed conductor 13 are formed on the upper surface of the module substrate 5b. The plurality of light-emitting elements 21 (LED dies) are arranged in the form of an array on the surface of the reflective layer 11, and the plurality of light-emitting elements 21 are connected in series on a row-by-row basis by bonding wires 23. The light-emitting elements 21 in each row are supplied with power via edge bonding wires 24. A sealing hole 25a formed in a frame member 25 is filled with a sealing member 28. The module substrate 5b has a structure in which a thin insulating layer is formed on the surface of a metal base plate such as aluminum for enhanced heat dissipation.

The reflective layer 11 and the power feed conductors 12 and 13 are patterned on the surface of the insulating layer 7 of the module substrate 5b by plating and etching. The power feed conductors 12 and 13 are formed in such a manner as to sandwich the reflective layer 11 from both sides thereof. The upper surfaces of the reflective layer 11 and power feed conductors 12 and 13 are formed from Ag to provide a higher reflectance than that of the insulating layer (not shown) formed on the surface of the module substrate 5a. The total reflectance of each of the reflective layer 11 and power feed conductors 12 and 13 is about 90.0%. Two power feed terminals 14 and 15 are also patterned on the surface of the insulating layer, and the light-emitting module 1a is connected to a lighting apparatus via insulating coated wires not shown. The reflective layer 11 also serves as a heat spreader which spreads out the heat generated by the plurality of light-emitting elements 21.

PRIOR ART DOCUMENTS

Patent Documents

Patent document 1: Japanese Unexamined Patent Publication No. 2007-157690 (FIG. 2)
Patent document 2: Japanese Unexamined Patent Publication No. 2011-14878 (FIG. 3)

SUMMARY

Since the LED module design shown in FIG. 7 was originally intended to reduce the thickness of the LED lamp, patent document 1 makes no specific mention of the way of improving the light-emitting efficiency of the LED elements (LEDs 3). By contrast, in the case of the LED module (light-emitting module 1a) shown in FIG. 8, the light-emitting efficiency can be enhanced because the reflectance of the area surrounding the LED dies (light-emitting elements 21) is increased. However, since the LED module is separate from the lighting apparatus 121, it cannot be said that the LED module shown in FIG. 8 is easier to use than the LED module shown in FIG. 7.

In an LED module constructed by mounting a plurality of LED elements on a circuit substrate along with other electronic components, it is an object of the present invention to provide an LED module wherein provisions are made to facilitate the fabrication of the LED module while ensuring good reflectance characteristics.

There is provided an LED module includes a submount substrate for mounting a plurality of LED elements, a module substrate for mounting the submount substrate and for also mounting other electronic components than the plurality of LED elements, a dam member which is disposed on the module substrate so as to surround a mounting area where the submount substrate is mounted, and a covering material which is filled into an area inside the dam member so as to cover upper faces of the plurality of LED elements, wherein the reflectance of a surface of the submount substrate is set higher than the reflectance of a surface of the module substrate.

There is also provided an LED module includes a submount substrate for mounting a plurality of LED elements, a module substrate for mounting the submount substrate and for also mounting other electronic components than the plurality of LED elements, and a covering material which covers upper faces of the plurality of LED elements, wherein the reflectance of a surface of the submount substrate is set higher than the reflectance of a surface of the module substrate, each of the plurality of LED elements has an electrode face with two protruding electrodes formed thereon, a phosphor layer as the covering material is formed on a face opposite from the electrode face or on a side face, and the protruding electrodes are connected directly to electrodes formed on the submount substrate.

Preferably, in the LED module, the covering material is a phosphor resin and covers the wire.

Preferably, in the LED module, the submount substrate is a circular plate.

Preferably, in the LED module, the dam member is constructed by forming a strip of uniform width in the shape of a ring.

Preferably, in the LED module, the dam member is spaced a certain distance away from an outer periphery of the module substrate.

Preferably, in the LED module, the plurality of LED elements are mounted face up on the submount substrate, and the plurality of LED elements are connected to each other by a wire.

Preferably, in the LED module, the plurality of LED elements are flip-chip mounted on the submount substrate.

Preferably, in the LED module, a wiring pattern on the module substrate is connected by a wire to a wiring pattern on the submount substrate or to the plurality of LED elements.

Preferably, in the LED module, the submount substrate has a surface comprising an enhanced reflective film formed on a metal surface.

Preferably, in the LED module, the submount substrate has a surface formed from a white ceramic material.

Preferably, in the LED module, the module substrate is a metal substrate comprising a metal base and an insulating layer.

Preferably, in the LED module, the submount substrate is mounted on the insulating layer.

Preferably, in the LED module, the insulating layer has an opening, and the submount substrate is mounted inside the opening and is connected directly to the metal base of the module substrate.

Preferably, in the LED module, the wiring pattern on the module substrate and the wiring pattern on the submount substrate are connected to each other by an elastic metal member.

Since the area surrounding the LED elements is made to have a high reflectance, the LED module achieves high light-emitting efficiency. Further, since the module substrate as the circuit substrate and the submount substrate are separate from each other, and the kinds of the components to be mounted on the respective are different, the design and manufacturing conditions can be set differently for the respective components, and besides, there is no difficulty in mounting them separately on the module substrate and the submount substrate. That is, the LED module of the present invention is made easier to fabricate while ensuring good reflectance characteristics.

Further, in the LED module, since the LED elements are not mounted on the module substrate, the wiring pitch, land surface treatment conditions, etc. can be set appropriately according to the other electronic components to be mounted thereon. Similarly, since no other components other than the LED elements are mounted on the submount substrate, the mounting conditions can be set appropriately according to the LED elements to be mounted thereon. That is, if the mounting conditions are significantly different between the module substrate and the submount substrate, the design and manufacturing conditions can be set independently of each other, and besides, the submount substrate can be mounted on the module substrate with no difficulty; hence, the advantage that the LED module is easy to fabricate.

At least the upper faces of the LED elements are covered with the covering material which is a resin or like material, but since the dam member for limiting the flow of the covering material is not provided on the submount substrate, the dam member does not interfere with the reflection from the submount substrate. In this case, there is no need to increase the surface reflectance of the module substrate, since the electronic components other than the LED elements are mounted on the module substrate and these components have no direct relevance to the light emission. That is, in the LED module, despite that fact that the submount substrate having a relatively small area is mounted on the module substrate having a relatively large area, a high reflectance can be obtained from the area surrounding the LED elements, and high light-emitting efficiency can be achieved because of the absence of the dam member on the submount substrate.

DESCRIPTION

Figure 1:
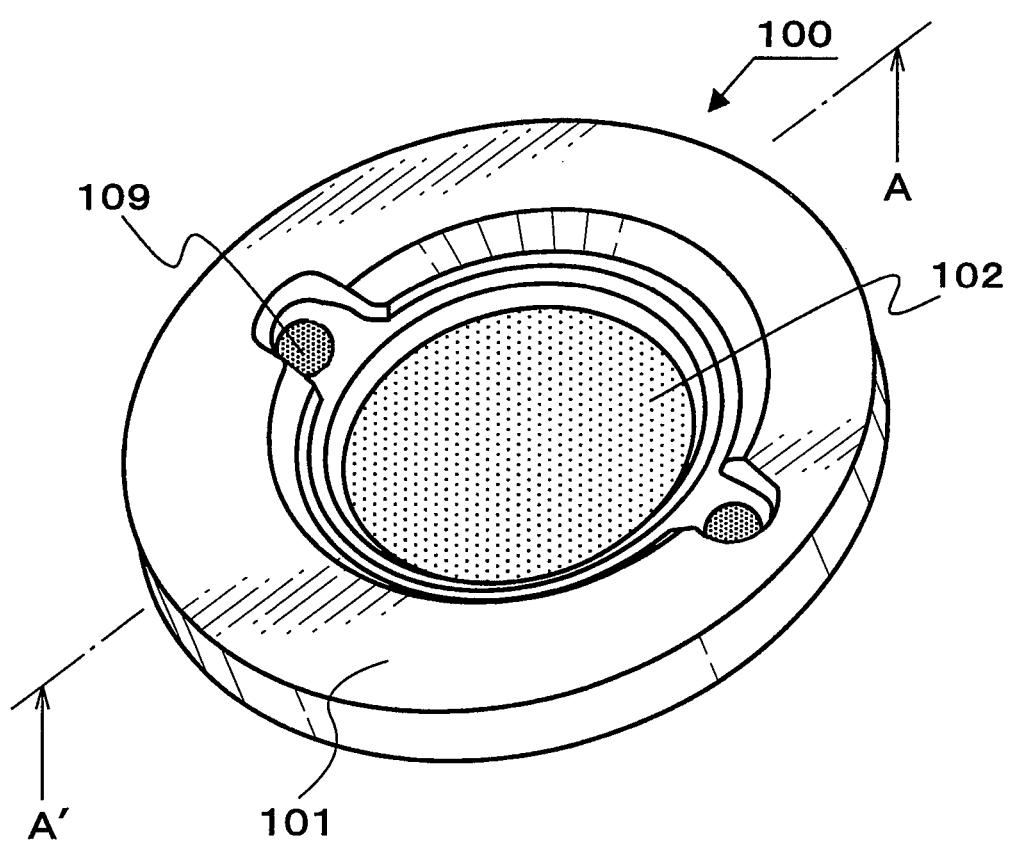
FIG. 1 is a perspective view showing the external appearance of an LED module 100.

LED modules will be described below with reference to the drawings. However, it will be noted that the technical scope of the present invention is not limited by any particular embodiment described herein but extends to the inventions described in the appended claims and their equivalents. It will also be noted that throughout the drawings, the same or corresponding component elements are designated by the same reference numerals and the description of the component elements, once given, will not be repeated thereafter. Further, since LED elements take a number of forms, an LED element in the form of a bare chip diced from a wafer will be referred to as an LED die, to distinguish it from a packaged LED which refers to an LED element constructed by encapsulating an LED die with a phosphor-containing resin or the like.

FIG. 1 is a perspective view showing the external appearance of an LED module 100.

The LED module 100 includes a housing 101 having an opening in the center thereof, and a phosphor resin 102 (covering material) can be seen through the opening. The housing 101 has two mounting holes 109.

Figure 2:
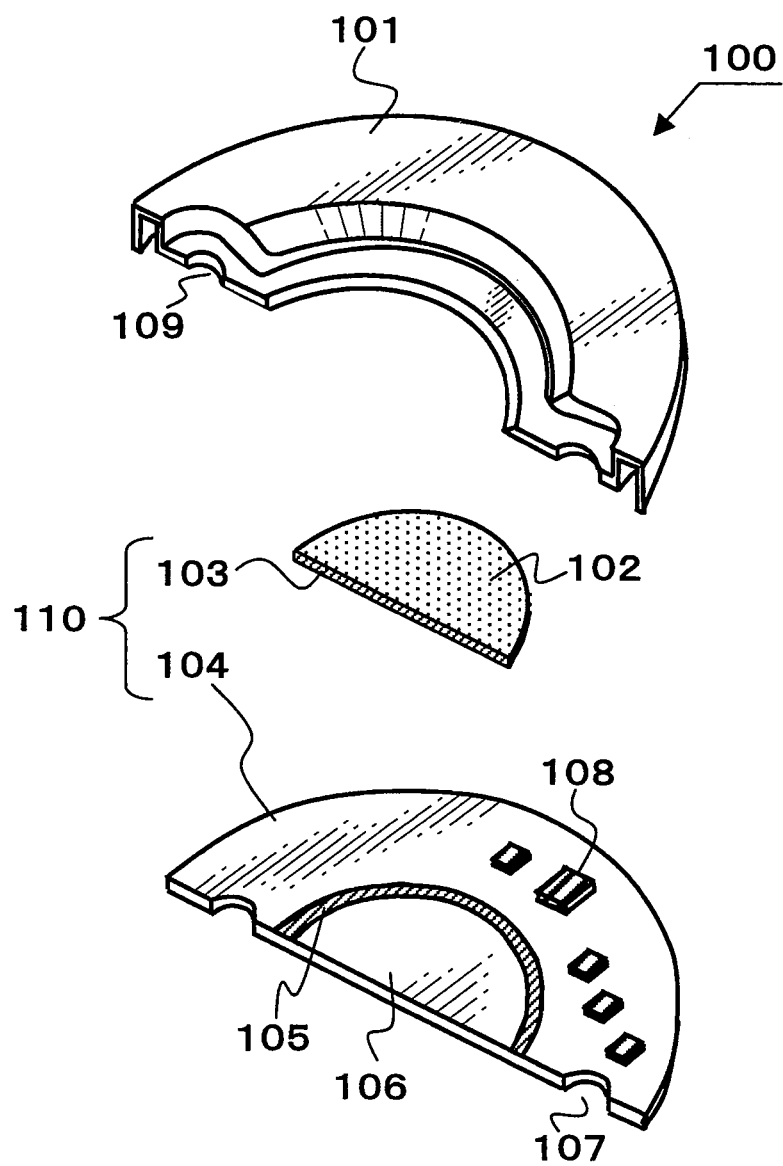
FIG. 2 is a diagram showing one of the halves into which the LED module 100 has been cut after assembly.

FIG. 2 is a diagram showing one of the halves into which the LED module 100 has been cut after assembly.

Figure 3:
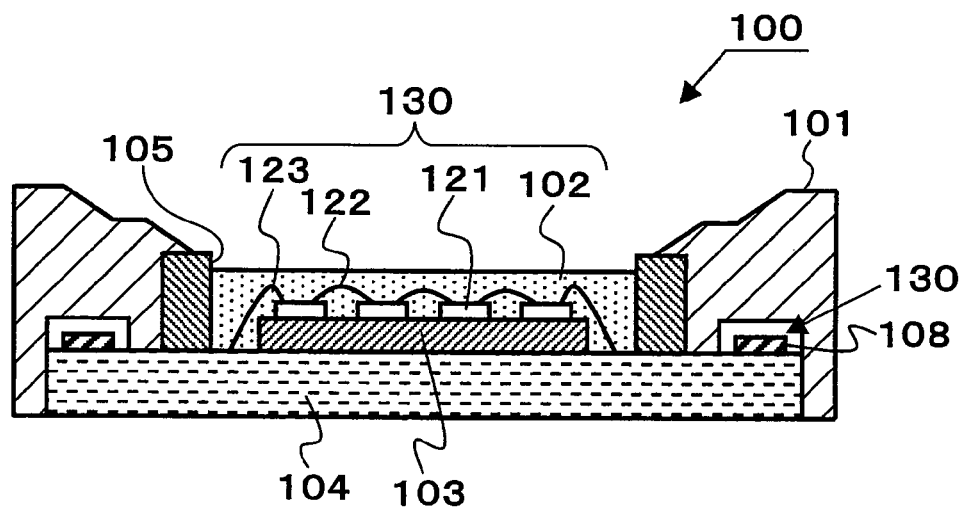
FIG. 3 is a cross-sectional view taken along line AA' in FIG. 1.

The LED module 100 comprises the housing 100 and a circuit substrate 110, and the circuit substrate 110 includes a submount substrate 103 and a module substrate 104. The submount substrate 103 is a circular plate whose upper surface is covered with the phosphor resin 102. LED dies 121 (LED elements), shown in FIG. 3, are mounted on the upper surface of the submount substrate 103. The module substrate 104 is a circular plate having two mounting holes 107, and is fitted into the housing 101. A dam member 105 is provided on the upper surface of the module substrate 104, and the area inside the dam member 105 is a mounting area 106 where the submount substrate 103 is mounted, while the area outside the dam member 105 is an area for mounting electronic components 108 (other electronic components). The dam member 105 is constructed by forming a strip of substantially uniform width in the shape of a ring.

FIG. 3 is a cross-sectional view taken along line AA' in FIG. 1.

As shown in FIG. 3, the submount substrate 103 is placed on the module substrate 104 along with the dam member 105 and the electronic components 108. The LED dies 121 are mounted on the submount substrate 103 and connected to each other by a wire 122. The LED dies 121 mounted at both edges of the submount substrate 103 are each connected by a wire 123 to a wiring pattern 125 (see FIG. 4) formed on the module substrate 104. The dam member 105 is provided so as to enclose the submount substrate 103, and the phosphor resin 102 is filled into the area inside the dam member 105. The phosphor resin 102 covers the LED dies 121 as well as the wires 122 and 123. The housing 101 includes the opening 130 in which the phosphor resin 102 is exposed and a hollow portion 131 in which the electronic components 108 are enclosed, and is fitted onto the module substrate 104.

Figure 4:
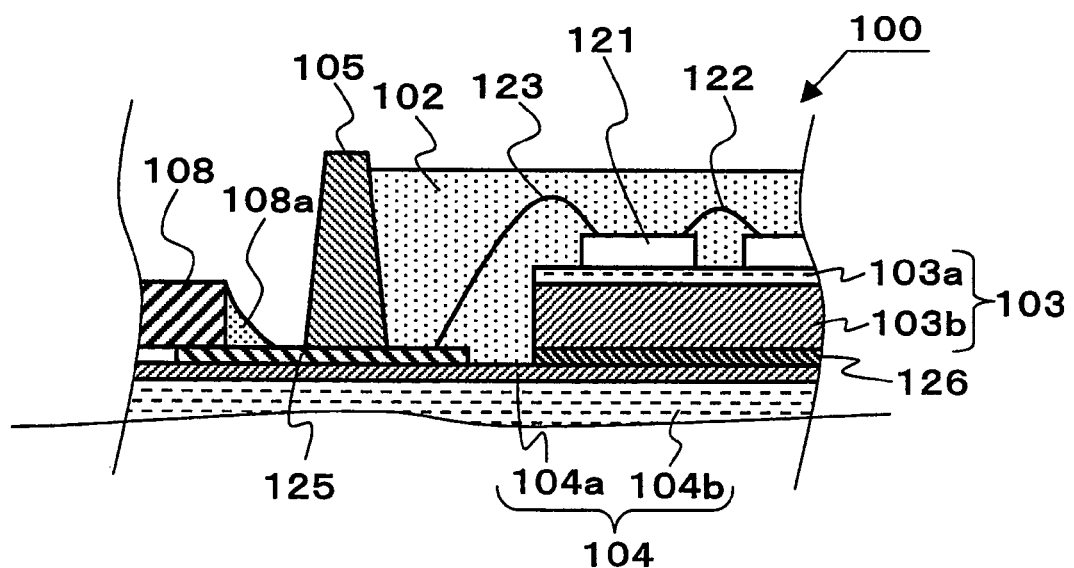
FIG. 4 is an enlarged view of a portion of the cross section of the LED module 100 shown in FIG. 3.

FIG. 4 is an enlarged view of a portion of the cross section of the LED module 100 shown in FIG. 3, with the housing 101 omitted from illustration.

As shown in FIG. 4, the submount substrate 103 comprises an enhanced reflective film 103a and an aluminum base 103b. The enhanced reflective film 103a is a multilayer film formed from a transparent oxide such as $SiO_2$, while the aluminum base 103b is formed from high-purity aluminum. The module substrate 104 comprises an insulating layer 104a and a metal base 104b. The insulating layer 104a is formed from a PI (polyimide) resin, but use may be made of some other suitable organic film, the material being selected by considering the dielectric breakdown voltage and thermal conductivity. The metal base 104b is formed from aluminum having good thermal conductivity, but the material need not have high purity since there is no need to account for reflectivity.

The LED dies 121 are mounted face up on the submount substrate 103. The face-up mounting means that the LED dies 121 are each mounted with the electrode side facing the direction (the upward direction in FIG. 4) opposite from the mounting side, and their electrodes are connected by the wires 122 and 123. The LED dies 121 are die-bonded to the enhanced reflective film 103a by an adhesive material not shown. The submount substrate 103 is bonded to the module substrate 104 by an adhesive material 126. The wiring pattern 125 is formed on the module substrate 104, and the electronic components 108 are connected to the wiring pattern 125 by solder 108a.

The LED dies 121 each measure, for example, 500 μm by 290 μm, and the submount substrate 103 is about 0.15 to 0.30 mm in thickness. The adhesive material 126 is selected from among materials that cure when heat and pressure are applied. The thickness of the insulating layer 104a on the module substrate 104 is determined by considering the breakdown voltage, as earlier described; for example, if a breakdown voltage of 4 kV is needed, a thickness of about 0.1 mm is sufficient in the case of a PI resin. The wiring pattern 125 on the module substrate 104 is formed by depositing Ni or Au on Cu. The dam member 105 is formed from a silicone resin, and has a width of 0.7 to 1.0 mm and a height of 0.5 to 0.8 mm. The phosphor resin 102 is a phosphor-containing silicone resin, and is formed to a thickness of about 400 to 800 μm.

Next, a fabrication method for the LED module 100 will be described with reference to FIGS. 2 to 4.

First, the electronic components 108 are mounted on the module substrate 104 by solder reflow. At the same time, the LED dies 121 are die-bonded to the submount substrate 103 and thereafter wire-bonded.

Then, the submount substrate 103 is bonded to the module substrate 104 by the adhesive material 126, and the LED dies 121 are connected to the wiring pattern 125 by the wires 123.

Next, a curable material for forming the dam member 105 is dispensed using a dispenser to form a strip of substantially uniform width in the shape of a ring surrounding the submount substrate 103, and is cured at about 150° C. to complete the formation of the dam member 105.

Next, the phosphor resin 102 is filled into the area inside the dam member 105 by using a dispenser, and cured at about 150° C.

Finally, the housing 101 is attached to the module substrate 104 to complete the fabrication of the LED module 100.

As described above, the LED module 100 is constructed by bonding the expensive submount substrate 103 having high reflectance onto the inexpensive module substrate 104. Since the submount substrate 103 can be made small in size, the LED module 100 offers the advantage of reducing the manufacturing cost while ensuring high reflectance. Further, since the dam member 105 is provided on the module substrate 104 side, there are no reflection-interfering members, other than the LED dies 121 and wires 122, on the submount substrate 103, which serves to further increase the reflectance. Furthermore, the circular shape of the submount substrate 13 facilitates the design of a lens and reflector for uniformly dispersing the emitted light. A further advantage is that the electronic components 108 can be arranged in an area (the hollow portion 131) provided between the dam member 105 and the outer circumference of the module substrate 104.

Figure 5:
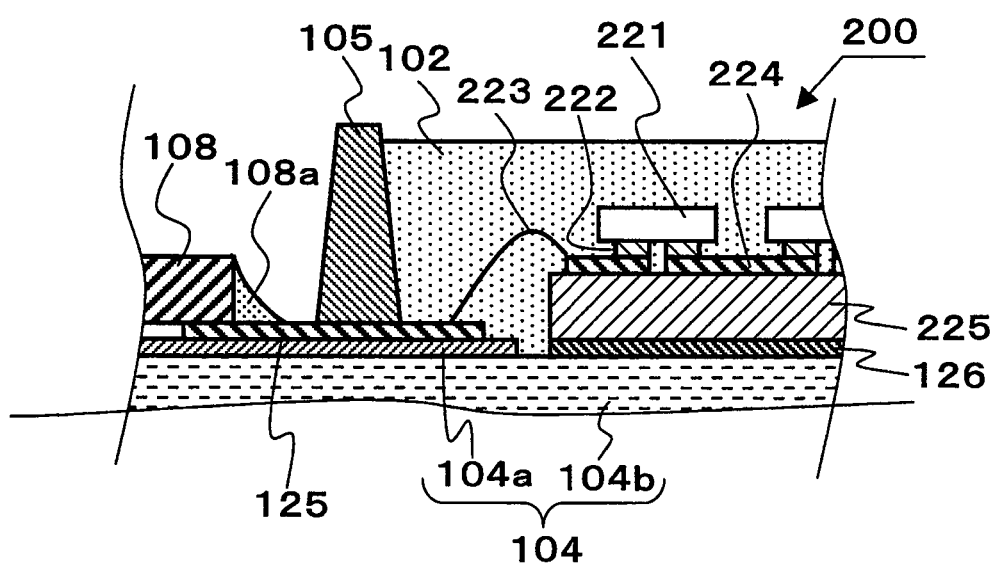
FIG. 5 is an enlarged cross-sectional view showing a portion of an alternative LED module 200.

FIG. 5 is an enlarged cross-sectional view showing a portion of an alternative LED module 200.

The LED module 100 described above exhibits a high breakdown voltage because the submount substrate 103 is bonded to the insulating layer 104a formed on the module substrate 104. However, the presence of the insulating layer 104a may result in a degradation of heat dissipation efficiency. If priority is to be given to the heat dissipation efficiency, the insulating layer 104a underlying the submount substrate 103 should be removed. Further, in the LED module 100, the submount substrate 103 is constructed from a high-reflectance Al substrate, and the LED dies 121 are mounted thereon by die bonding and wire bonding (face-up mounting). However, the submount substrate need not be limited to a high-reflectance aluminum substrate, and the LED die mounting method also need not be limited to the face-up mounting. In view of this, in the LED module 200, priority is given to the heat dissipation efficiency, and the submount substrate is formed from ceramic, with provisions made to mount the LED dies thereon using flip-chip technology.

The external view, assembly view, and cross-sectional view of the LED module 200 are the same as those given in FIGS. 1 to 3 of the LED module 100, and therefore will not be redrawn here. In FIG. 5, only a cross-sectional view showing a portion of the LED module 200 in enlarged form is presented. The housing 101 is omitted from illustration in FIG. 5.

The LED module 200 differs from the LED module 100 in the LED dies 221 used and their mounting method, the material for the submount substrate 225 and its upper surface structure, and the opening formed in the insulating layer 104a of the module substrate 104 and the connecting structure in the opening (see FIGS. 4 and 5).

In the case of the LED dies 221, the bottom face is the electrode face on which protruding electrodes 222 are formed. The protruding electrodes 222 are connected to the wiring pattern 224 formed on the upper surface of the submount substrate 225. The mounting method in which the electrode face of a substrate and the electrode face of a semiconductor device are placed facing each other and their electrodes are connected directly is called the flip-chip mounting (also called the face-down mounting).

The wiring pattern 224 on the submount substrate 225 is connected to the wiring pattern 125 on the module substrate 104 by a wire 223. The submount substrate 225 is formed from a white ceramic material, and achieves high reflectance with the white surface exposed everywhere except where the mounting areas of the LED dies 221 and the interconnecting wiring pattern 224 are provided.

In the module substrate 104 of the LED module 200, the area (opening) where the insulating layer 104a is not formed is used as the mounting area 106 (see FIG. 2) where the submount substrate 225 is mounted. Therefore, the bottom face of the submount substrate 225 is connected directly via the adhesive material 126 to the metal base 104b of the module substrate 104. As a result, the heat generated by the LED dies 221 is conducted from the submount substrate 225 directly to the metal base 104b, thus increasing the heat dissipation efficiency of the LED module 200.

In the above LED module 200, the submount substrate 225 is formed from a white ceramic material, but instead, a white ceramic layer may be formed only on the surface of the submount substrate to increase its reflectance. For example, the submount substrate may be constructed by using low-reflectance aluminum nitride as the base material and by applying thereon a material that turns into a white glass-like state when sintered. Further, the wiring lines may be formed on the aluminum nitride base, and a material that turns into a white glass-like state when sintered may be applied to fill the spacing between the wiring lines on the substrate. A material that turns into a white glass-like state when sintered is, for example, a material prepared by mixing fine reflective particles such as titanium oxide or alumina and a catalyst into organopolysiloxane, and this material cures at about 150° C.

Figure 6:
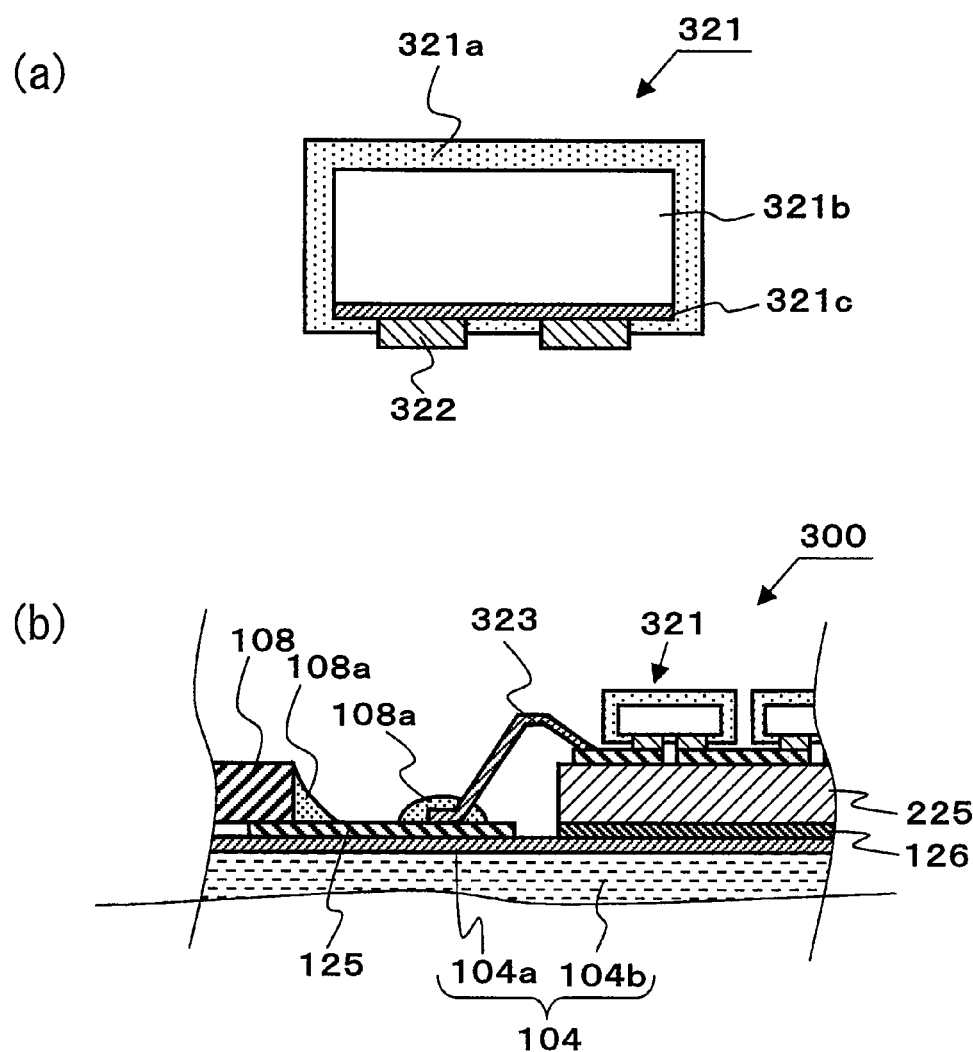
FIG. 6(*a*) is a cross-sectional view of an LED element 321 used in a further alternative LED module 300, and FIG. 6(*b*) is an enlarged cross-sectional view showing a portion of the LED module 300.
Figure 7:
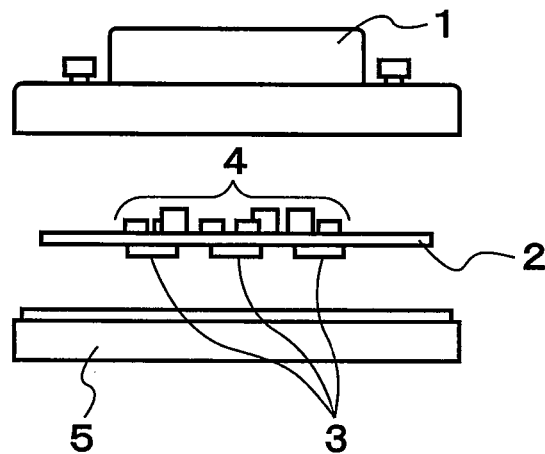
FIG. 7 is a diagram redrawn from FIG. 2 given in patent document 1.
Figure 8:
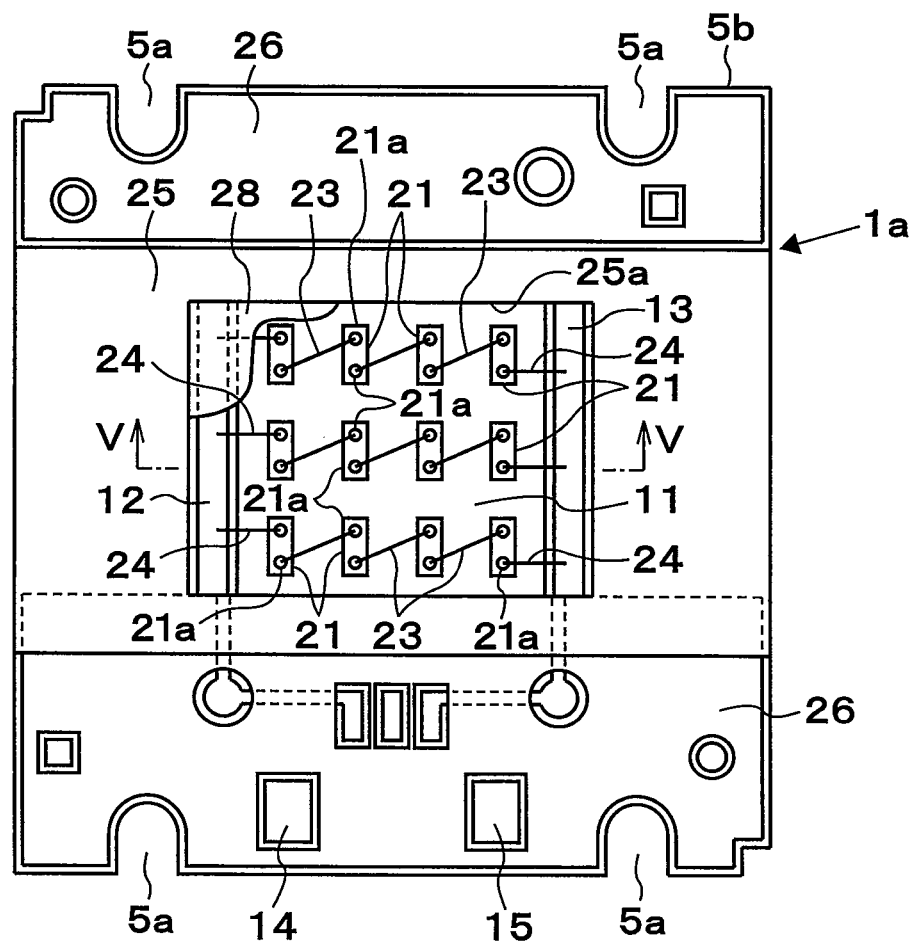
FIG. 8 is a diagram redrawn from FIG. 3 given in patent document 2.

FIG. 6(a) is a cross-sectional view of an LED element 321 used in a further alternative LED module 300, and FIG. 6(b) is an enlarged cross-sectional view showing a portion of the LED module 300.

The LED modules 100 and 200 use the LED dies 121, 221 as the LED elements. Therefore, the area inside the dam member 105 is filled with the phosphor resin 102 to cover the LED dies 121, 221 and the wires 122, 123, 223. However, the LED elements used need not be limited to LED chips. The following therefore describes the LED module 300 which uses LED elements assembled into chip-size packages (hereinafter called the packaged LEDs).

Each individual LED element contained in the LED module 300 is provided with a phosphor layer 321a (see FIG. 6(a)) formed so as to encapsulate it, as will be described later. If an external view corresponding to FIG. 1 is drawn for the LED module 300, the packaged LEDs 321 each encapsulated with the phosphor layer 321a (see FIG. 6(a)) and the surface of the submount substrate 225 (see FIG. 6(b)) exposed between the packaged LEDs 321 will be seen through the opening of the housing 101. Otherwise, the external view of the LED module 300 is the same as that of the LED module 100.

If the assembly view corresponding to FIG. 2 is drawn for the LED module 300, it will be seen that the need for the dam member 105 (see FIG. 2) is eliminated. Otherwise, the assembly view of the LED module 300 is the same as that of the LED module 100. Therefore, the LED module 300 will be described below with reference to the enlarged cross-sectional view (FIG. 6(b)) showing a portion of the cross section of the LED module 300. The housing is omitted from illustration in FIG. 6(b).

As shown in FIG. 6(a), the LED die is provided with a semiconductor layer 321c formed on the lower surface of a transparent insulating substrate 321b of sapphire or the like, and two protruding electrodes 322 are formed on the lower surface of the semiconductor layer 321c. The protruding electrodes 322 are an anode and a cathode, respectively. The phosphor layer 321a is formed by mixing phosphor particles into a silicone resin, kneading the mixture, and curing the mixture, and is deposited to a thickness of about 100 μm on the side and upper faces. The phosphor layer 321a is also formed on the bottom face of the packaged LED 321, but is thinner than the phosphor layer 321a formed on the side and upper faces, since the bottom phosphor layer 321a is only provided to protect the bottom face.

As in the LED module 200, the submount substrate 225 in the LED module 300 is a ceramic substrate, and the wiring pattern 224 is formed on the upper surface thereof. Similarly, the module substrate 104 is the same as that used in the LED module 100. In the LED module 300, the packaged LEDs 321 are flip-chip mounted on the submount substrate 225, and the wiring pattern 224 on the submount substrate 225 is connected to the wiring pattern 125 on the module substrate 104 by a small metal piece 323 (elastic metal member). The small metal piece 323 is rigidly fastened to the wiring pattern 125 on the module substrate 104 by solder 108a. The submount substrate 225 is bonded to the module substrate 104 by the adhesive material 126.

The submount substrate 225 of the LED module 300 achieves high reflectance because the white ceramic surface is exposed everywhere except where the wiring pattern 224 and the packaged LEDs 321 are formed. That is, in the LED module 300, the reflectance of the surface of the submount substrate 225 is set higher than the reflectance of the surface of the module substrate 104. More specifically, the submount substrate 225 constructed from a ceramic substrate has a reflectance of 90 to 95%, whereas the module substrate 104 has a reflectance of 70 to 80% even when it is painted white. The description given of the reflectance difference between the module substrate and the submount substrate also applies to the LED modules 100 and 200.

The LED module 300 is easier to fabricate because of the elimination of the dam member. The connection between the wiring pattern 224 on the submount substrate 225 and the wiring pattern 125 on the module substrate 104 may be accomplished by soldering or by using a connector. In this case, there is no need to set up a wire bonder in the fabrication process.

In the LED modules 100, 200, and 300 described above, the high-reflectance area is limited to the mounting area where the LED elements (LED dies 121, 221 or packaged LEDs 321) are mounted. The reason is that the high-reflectance member using ceramic, aluminum, or like material is generally costly and, therefore, from the standpoint of reducing the cost, it is preferable to limit the high-reflectance area and thus reduce the size of the high-reflectance member used. Further, in the LED modules 100, 200, and 300, the module substrate 104 has been described as comprising the protective film 104a and the metal base 104b, but instead, the module substrate 104 may be formed, for example, from a resin or a ceramic material such as aluminum nitride. Furthermore, the housing 101 shown in the description of the LED module 100 is not necessarily an essential component, because the casing or the like of lighting equipment into which the LED module is to be assembled can be substituted for the housing.

DESCRIPTION OF THE REFERENCE NUMERALS 100, 200, 300 . . . LED MODULE
101 . . . HOUSING
102 . . . PHOSPHOR RESIN
103, 225 . . . SUBMOUNT SUBSTRATE
103a . . . ENHANCED REFLECTIVE FILM
103b . . . ALUMINUM BASE
104 . . . MODULE SUBSTRATE
104a . . . INSULATING LAYER
104b . . . METAL BASE
105 . . . DAM MEMBER
106 . . . MOUNTING AREA
107, 109 . . . MOUNTING HOLE
108 . . . ELECTRONIC COMPONENTS (OTHER ELECTRONIC COMPONENTS)
108a . . . SOLDER
110 . . . CIRCUIT SUBSTRATE
121, 221 . . . LED DIE (LED ELEMENT)
125 . . . WIRING PATTERN
126 . . . ADHESIVE MATERIAL
222, 322 . . . PROTRUDING ELECTRODE
224 . . . WIRING PATTERN
321 . . . PACKAGED LED (LED ELEMENT)
321a . . . PHOSPHOR LAYER
321b . . . TRANSPARENT INSULATING SUBSTRATE
321c . . . SEMICONDUCTOR LAYER
323 . . . SMALL METAL PIECE (ELASTIC METAL MEMBER)

What is claimed is:

1. An LED module containing a plurality of LED elements, comprising:
   a submount substrate for mounting said plurality of LED elements;
   a module substrate, which has a planate upper surface, for mounting said submount substrate and for also mounting other electronic components than said plurality of LED elements;
   a dam member which is disposed on said module substrate so as to surround a mounting area where said submount substrate is mounted;
   a covering material which is filled into an area inside said dam member so as to cover upper faces of said plurality of LED elements;
   a wiring pattern which is disposed within said dam member and on said module substrate; and
   a wire which connects a part of said plurality of LED elements mounted on said submount substrate to said wiring pattern disposed on a lower position comparing to said submount substrate, wherein
   said dam member is spaced a certain distance away from an outer periphery of said submount substrate,
   said module substrate has an area which is disposed around said submount substrate and directly covered by said covering material, and
   the reflectance of a surface of said submount substrate is set higher than the reflectance of a surface of said area of said module substrate.

2. The LED module according to claim 1, wherein said submount substrate and said module substrate are circular plates, respectively.

3. The LED module according to claim 2, wherein said dam member is constructed by forming a strip of uniform width in the shape of a ring.

4. The LED module according to claim 1, wherein a wiring pattern on said module substrate is connected by a wire to a wiring pattern on said submount substrate or to said plurality of LED elements.

5. The LED module according to claim 1, wherein said submount substrate has a surface comprising an enhanced reflective film formed on a metal surface or a surface formed from a white ceramic material, and said module substrate is a metal substrate comprising a metal base and an insulating layer.

6. The LED module according to claim 5, wherein said submount substrate is mounted on said insulating layer.

7. The LED module according to claim 5, wherein said insulating layer has an opening, and wherein said submount substrate is mounted inside said opening and is connected directly to said metal base of said module.

8. The LED module according to claim 1, further comprising a housing which holds an outer rim of said module substrate.

9. An LED module containing a plurality of LED elements, comprising:
   a submount substrate for mounting said plurality of LED elements;
   a module substrate, which has a planate upper surface, for mounting said submount substrate and for also mounting other electronic components than said plurality of LED elements;
   a plurality of covering materials, each of which covers an upper face and a side face of each of said plurality of LED elements, and
   a wiring pattern which is disposed on said module substrate, wherein
   said module substrate has an area which is disposed around said submount substrate and is not covered by said covering material,
   the reflectance of a surface of said submount substrate is set higher than the reflectance of a surface of said area of said module substrate,
   each of said plurality of LED elements has an electrode face with two protruding electrodes formed thereon,
   each of said plurality of covering materials is a phosphor layer, and
   said protruding electrodes are connected to said wiring pattern.

10. The LED module according to claim 9, wherein said submount substrate has a surface comprising an enhanced reflective film formed on a metal surface or a surface formed from a white ceramic material, and said module substrate is a metal substrate comprising a metal base and an insulating layer.

11. The LED module according to claim 10, wherein said submount substrate is mounted on said insulating layer.

12. The LED module according to claim 10, wherein said insulating layer has an opening, and wherein said submount substrate is mounted inside said opening and is connected directly to said metal base of said module substrate.

13. The LED module according to claim 9, wherein said wiring pattern on said module substrate and a wiring pattern on said submount substrate are connected to each other by an elastic metal member.

14. The LED module according to claim 9, wherein said submount substrate and said module substrate are circular plates, respectively.

\* \* \* \* \*